United States Patent
Barraud et al.

(10) Patent No.: US 9,911,841 B2
(45) Date of Patent: Mar. 6, 2018

(54) SINGLE-ELECTRON TRANSISTOR AND ITS FABRICATION METHOD

(71) Applicant: Commissariat a l'Energie Atomique et aux Energies Alternatives, Paris (FR)

(72) Inventors: Sylvain Barraud, Le Grand Lemps (FR); Ivan Duchemin, Fontaine (FR); Louis Hutin, Saint Martin le Vinoux (FR); Yann-Michel Niquet, Saint Martin le Vinoux (FR); Maud Vinet, La Haye Fouassiere (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/066,590

(22) Filed: Mar. 10, 2016

(65) Prior Publication Data

US 2016/0268406 A1    Sep. 15, 2016

(30) Foreign Application Priority Data

Mar. 11, 2015   (FR) ..................... 15 52005

(51) Int. Cl.
*H01L 29/76* (2006.01)
*H01L 29/06* (2006.01)
(Continued)

(52) U.S. Cl.
CPC .......... *H01L 29/7613* (2013.01); *B82Y 10/00* (2013.01); *H01L 29/0665* (2013.01);
(Continued)

(58) Field of Classification Search
None
See application file for complete search history.

(56) References Cited

U.S. PATENT DOCUMENTS 5,834,793 A    11/1998  Shibata
2006/0118899 A1  6/2006  Jang et al.
(Continued)

FOREIGN PATENT DOCUMENTS

CN    1953205        4/2007
EP    1 860 600 A1   11/2007
(Continued)

OTHER PUBLICATIONS

English translation (machine) of KR 100800508 B1 is attached.*
(Continued)

*Primary Examiner* — Khaja Ahmad
(74) *Attorney, Agent, or Firm* — Oblon, McClelland, Maier & Neustadt, L.L.P.

(57) ABSTRACT

Single-electron transistor comprising at least:
  first semiconductor portions forming source and drain regions,
  a second semiconductor portion forming at least one quantum island,
  third semiconductor portions forming tunnel junctions between the second semiconductor portion and the first semiconductor portions,
  a gate and a gate dielectric located on at least the second semiconductor portion,
  in which a thickness of each of the first semiconductor portions is greater than the thickness of the second semiconductor portion, and in which a thickness of the second semiconductor portion is greater than the thickness of each of the third semiconductor portions.

18 Claims, 9 Drawing Sheets

(51) Int. Cl.
  *H01L 29/66* (2006.01)
  *H01L 29/786* (2006.01)
  *B82Y 10/00* (2011.01)
  *H01L 29/10* (2006.01)

(52) U.S. Cl.
  CPC ...... *H01L 29/0669* (2013.01); *H01L 29/1033* (2013.01); *H01L 29/66439* (2013.01); *H01L 29/66469* (2013.01); *H01L 29/66545* (2013.01); *H01L 29/78618* (2013.01); *H01L 29/78696* (2013.01)

(56) References Cited

U.S. PATENT DOCUMENTS

| | | | |
|---|---|---|---|
| 2008/0142888 A1* | 6/2008 | Ko | H01L 29/78618 257/354 |
| 2009/0137102 A1* | 5/2009 | Rooyackers | B82Y 10/00 438/479 |
| 2010/0148155 A1* | 6/2010 | Choi | H01L 29/78606 257/40 |
| 2010/0330751 A1* | 12/2010 | Choi | B82Y 10/00 438/151 |

FOREIGN PATENT DOCUMENTS

| | | | |
|---|---|---|---|
| EP | 2 239 781 A1 | 10/2010 | |
| KR | 100800508 B1 * | 2/2008 | |
| KR | 10-2011-0133946 | 12/2011 | |
| WO | WO 2010/150407 A1 | 12/2010 | |
| WO | WO 2010150407 A1 * | 12/2010 | G11C 11/39 |

OTHER PUBLICATIONS

English translation (machine) of WO 2010150407 A1 is attached.*
French Preliminary Search Report dated Jan. 15, 2016 in French Application 15 52005, file Mar. 11, 2015 (with English Translation of Categories of Cited Documents).
U.S. Appl. No. 14/445,228, filed Jul. 29, 2014, 2015/0056734 A1, Laurent Grenouillet et al.
U.S. Appl. No. 14/450,385, filed Aug. 4, 2014, 2015/0044841 A1, Perrine Batude et al.
U.S. Appl. No. 14/581,029, filed Dec. 23, 2014, 2015/0194489 A1, Sylvain Barraud et al.
U.S. Appl. No. 14/425,977, filed Jul. 8, 2015, 2015/0340275 A1, Maud Vinet et al.
U.S. Appl. No. 14/425,891, filed Mar. 24, 2015, 2015/0294903 A1, Laurent Grenouillet et al.
U.S. Appl. No. 14/441,354, filed May 7, 2015, 2015/0294904 A1, Maud Vinet et al.
U.S. Appl. No. 14/849,060, filed Sep. 9, 2015, 2016/0071933 A1, Sylvain Maitrejean et al.
U.S. Appl. No. 14/782,190, filed Oct. 2, 2015, 2016/0035843 A1, Maud Vinet et al.
U.S. Appl. No. 14/982,852, filed Dec. 29, 2015, Sylvain Barraud et al.
U.S. Appl. No. 14/993,598, filed Jan. 12, 2016, Bernard Previtali et al.
Lei Zhuang et al. "Silicon Single-Electron Quantum-Dot Transistor Switch Operating at Room Temperature", Applied Physics Letters, vol. 72, No. 10, Mar. 9, 1998, 4 pages.
Yukinori Ono et al. "Fabrication Method for IC-Oriented Si Single-Electron Transistors", IEEE Transactions on Electron Devices, vol. 47, No. 1, Jan. 2000, 7 pages.
V. Deshpande et al. "Scaling of Trigate Nanowire (NW) MOSFETs Down to 5 nm Width: 300 K Transition to Single Electron Transistor, Challenges and Opportunities", 2012 Proceedings of the European Solid-State Device Research Conference (ESSDERC), 2012, 4 pages.
Masaharu Kobayashi et al. "Experimental Study on Quantum Confinement Effects in Silicon Nanowire Metal-Oxide-Semiconductor Field-Effect Transistors and Single-Electron Transistors", Journal of Applied Physics, vol. 103, 2008, 7 pages.
Yasuo Takahashi et al. "Conductance Oscillations of a Si Single Electron Transistor at Room Temperature", Electron Devices Meeting, IEDM'94, IEEE, 1994, 3 pages.
Y. Takahashi et al. "Fabrication Technique for Si Single-Electron Transistor Operating at Room Temperature", Electronics Letters, vol. 31, No. 2, Jan. 19, 1995, 2 pages.
S. J. Shin et al. "Si-Based Ultrasmall Multiswitching Single-Electron Transistor Operating at Room-Temperature", Applied Physics Letters, vol. 97, 2010, 4 pages.
S. Barraud et al. "Performance of Omega-Shaped-Gate Silicon Nanowire MOSFET with Diameter Down to 8 nm", IEEE Electron Device Letters, vol. 33, No. 11, Nov. 2012, 3 pages.

* cited by examiner

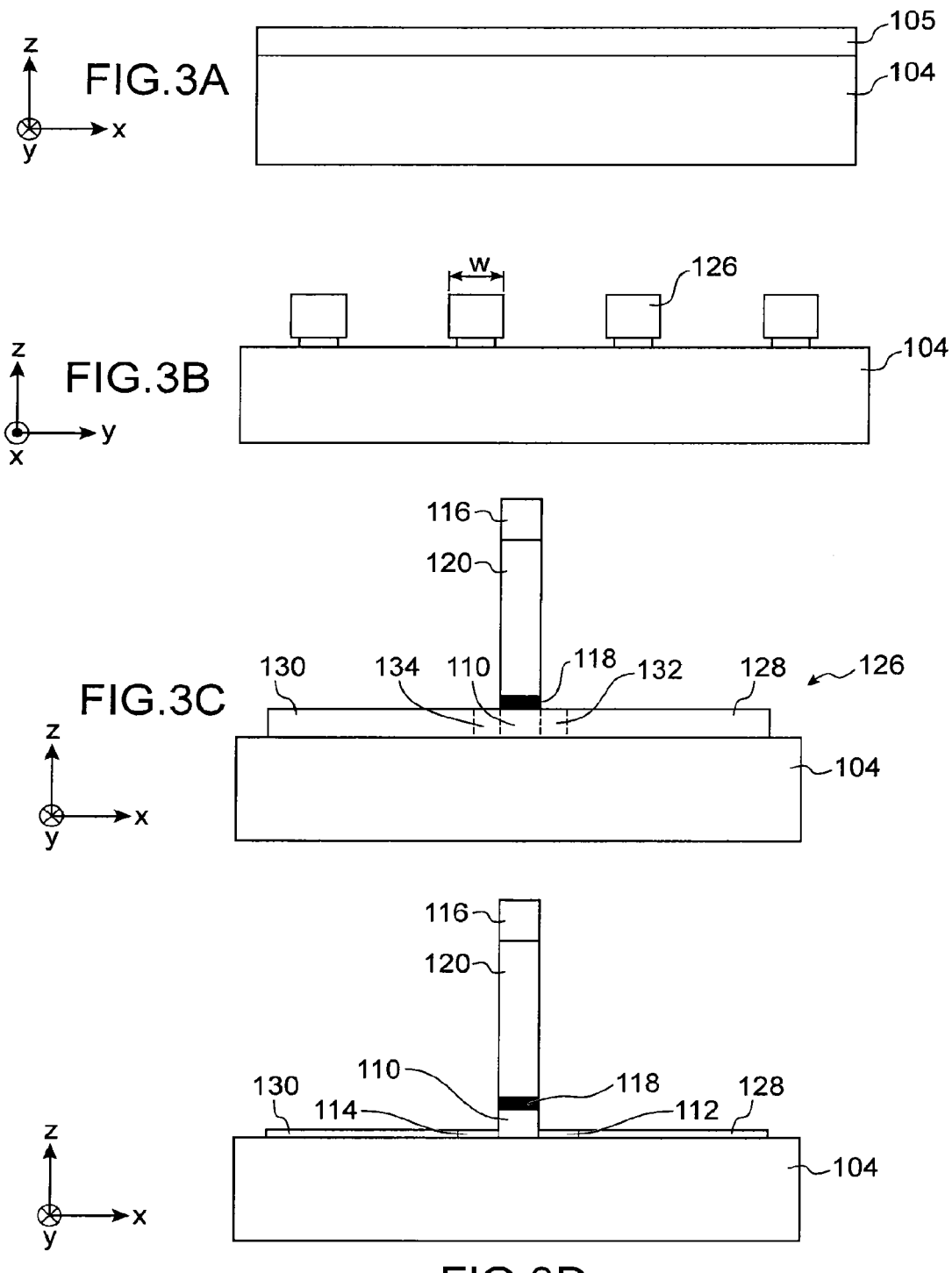

SINGLE-ELECTRON TRANSISTOR AND ITS FABRICATION METHOD

TECHNICAL DOMAIN AND PRIOR ART

The invention relates to a Single-electron Transistor (SET) or a Single-Hole Transistor (SHT), used for so-named single-electron applications (single-electron or single-hole electronics) and a method of making such a transistor. In particular, the invention can be applied to the field of quantum electronics, spintronics, or quantum computing when the SET transistor is used as a quantum bit (Qbit).

Single-electron electronics makes use of devices in which a current passage can be explained by quantification of the charge. The principle of these devices, named Coulomb blocking, is to associate the tunnel effect and the Coulomb interaction. The simplest single-electron device, also named a quantum dot, comprises two reservoirs of electrons/holes between which there is a metal or semiconducting island named a quantum island, isolated from the electron/hole reservoirs.

The Coulomb interaction between charges distributed on the island and in the reservoirs results in capacitive coupling. A current can be set up between the reservoirs passing through the island if the probability of an electron passing from one reservoir to the island by tunnel effect is non-zero and if two states of the island with N and N+1 electrons can be energetically accessed. Therefore the charge carried by the island can vary only in multiples of the elementary charge ±e. Such a quantum dot that forms an artificial atom is used particularly in the quantum computing field to form quantum bits or qbits, in spintronics, and in quantum electronics to form SET transistors.

An SET transistor comprises a quantum island forming the channel region of the transistor, isolated from the source and from the drain (that form the electron/hole reservoirs) by two tunnel barriers, or tunnel junctions. The quantum island is capacitively coupled with a gate electrode to control the passage of current through the quantum island, as for a MOSFET transistor. This capacitance is an electrostatic capacitance and is not a tunnel junction, the gate oxide being thick enough to prevent current from passing by tunnel effect from the gate to the quantum island.

The difficulty in making such an SET transistor lies in fabricating the quantum island (control of its position and its geometry) and creating the tunnel barriers.

The quantum island and the tunnel junctions of an SET transistor can be made by oxidation of a semiconductor portion, for example a silicon nanowire, forming the channel connecting the source and the drain. The document by Zhuang et al., «Silicon single-electron quantum-dot transistor switch operating at room temperature», APL, 72(10), pp. 1205-1207, 1998, discloses the making of quantum islands based on the use of variations present in the width of the channel obtained by lithography by electron or optical beam. These variations may for example be generated by the roughness of the resin used during lithography. These variations are amplified during oxidation. If oxidation continues for long enough periods, a series of quantum islands separated by constrictions are exposed. Only the smallest quantum island formed seems to control the behaviour of the device.

The main advantage of such an oxidation is its ease of use. Furthermore, this oxidation can reduce the dimensions of the quantum island, thus reducing its total capacity and increasing the operating temperature of the transistor (for example to 300 K). The use of such an oxidation can also obtain very low capacitance islands.

However, the making of quantum islands by oxidation does not give any real control over the number of quantum islands created, their position and dimensions. Therefore, this fabrication technique is not very suitable for use at an industrial scale.

The document by ONO et al., «Fabrication method for IC-oriented Si single-electron transistors», IEEE TED, pp. 147-153, 2000, discloses another technique for making SET transistors, named the PADOX («PAttern-Dependent OXidation») method, in which quantum islands are formed. This method is based on the fact that oxidation occurs preferentially at junctions between different structures. It is thus possible to have some control over the position of these junctions, and therefore the characteristics of the islands formed. As above, this approach makes use of thermal oxidation. In this method, a first silicon portion with a typical thickness of a few tens of nanometers is etched. The central part of the portion is then thinned by lithography/etching, thus creating junctions at differences in thickness between the central part and the adjacent parts of the semiconductor portion. An oxidation step is then applied to reduce the size of the central part and to expose a quantum island of silicon and two tunnel barriers at the two ends of this island.

Although this method can give better control over the position of the quantum island, it remains based on oxidation that takes a relatively long time to obtain small quantum islands.

Furthermore, regardless of the method used for their fabrication, SET transistors according to prior art enable to have Coulomb blocking on few levels, which results in a $I_D(Vg)$ characteristic (drain current as a function of the gate voltage) with no or few variations, in other words corresponding to a monotonic function or a function with few variations, for example one or two changes in the variation direction. This can cause difficulties with operation of the transistor, particularly at ambient temperature.

PRESENTATION OF THE INVENTION

Therefore, there is a need for a single-electron transistor (SET transistor), with a structure compatible with fabrication using technological steps with the CMOS technology and therefore not necessarily requiring the use of an oxidation step to form a quantum island, and with improved operation particularly at ambient temperature.

To achieve this, an embodiment of the invention discloses a single-electron transistor comprising at least:
  first semiconductor portions forming source and drain regions;
  a second semiconductor portion forming at least one quantum island;
  third semiconductor portions forming tunnel junctions between the second semiconductor portion and the first semiconductor portions;
  a gate and a gate dielectric located on at least the second semiconductor portion;
  in which a thickness of each of the first semiconductor portions is greater than the thickness of the second semiconductor portion, and in which a thickness of the second semiconductor portion is greater than the thickness of each of the third semiconductor portions.

Unlike SET transistors according to prior art, the structure of this SET transistor can be made using an integration scheme similar to schemes used for CMOS technologies in microelectronics that are very mature. Therefore this SET transistor can be easily integrated with MOSFET transistors for example for hybrid SET-FET applications (for example multiple-valued logic). Unlike SET transistors according to prior art, this transistor does not necessarily use an oxidation step to form the quantum island and tunnel junctions, and the position and geometry of the quantum island can be perfectly controlled because such a transistor can be made using only deposition, photolithography and etching steps.

Such an SET transistor is perfectly compatible with miniaturisation laws according to the CMOS technology (Moore's law) aiming at reducing thicknesses of semiconducting films used and the gate length, the structure of such a transistor possibly being very compact and for example being used to make the quantum island with a thickness of a few nanometers and a gate length of a few nanometers.

The SET transistor can be envisaged as a building block for quantum electronics.

Therefore in this SET transistor, since the thicknesses of the third portions that form the tunnel junctions are less than the thickness of the second portion that forms the quantum island, the heights of the barriers formed by these third semiconductor portions on each side of the quantum island, that forms a quantum well, are higher than in SET transistors according to prior art, for which the islands are formed by oxidation. This has the effect of increasing the charge energy in the quantum island of the SET transistor and increasing the number of possible energy levels in the quantum island. This also results in an $I_D(Vg)$ characteristic of the transistor with a larger number of variation direction changes. One consequence of this is that it improves operation of the SET transistor at ambient temperature while maintaining perfect control over the position of the quantum island.

The thicknesses of the various transistor elements, and particularly the various semiconductor portions of the transistor, correspond to the dimensions of these elements approximately perpendicular to a principal plane of a substrate on which the transistor is made. The thicknesses of the various semiconductor portions of the transistor also correspond to the dimensions of these portions approximately perpendicular to a plane that includes the first, second and third semiconductor portions.

The first, second and third semiconductor portions may be aligned with each other and be adjacent such that the second semiconductor portion is located between the third semiconductor portions and such that each of the third semiconductor portions is located between the second semiconductor portion and one of the first semiconductor portions.

The transistor may also comprise dielectric spacers located on the third semiconductor portions and bearing in contact with the side flanks of the gate, the gate dielectric and part of the second semiconductor portion.

The thickness of the second semiconductor portion may be between about 2 nm and 15 nm, and advantageously between about 2 nm and 5 nm for optimum operation, and/or the thickness of each of the third semiconductor portions may be between about 1 nm and 5 nm, and advantageously between about 1 nm and 2 nm for optimum operation, and/or a length of the third semiconductor portions that corresponds to a distance between the second semiconductor portion and one of the first semiconductor portions may be between about 10 nm and 40 nm or advantageously between about 15 nm and 40 nm, and/or a length of the second semiconductor portion that corresponds to a distance between the third semiconductor portions is less than or equal to about 10 nm. With such a length and such a thickness of the third semiconductor portions, the quantum island formed by the second semiconductor portion is well isolated from the transistor source and drain formed by the first semiconductor portions, which avoids disturbances generated by electron reservoirs formed by the source and drain on electrons present in the quantum island.

This effect is reinforced when the length of the third semiconductor portions is between about 15 nm and 40 nm, or between about 20 nm and 40 nm. Furthermore, such a length and such a thickness of the second semiconductor portion give the transistor good operating efficiency.

The difference between the thickness of the second semiconductor portion and the thickness of each of the third semiconductor portions may be between about 1 nm and 10 nm.

The width of each of the second and third semiconductor portions may be less than or equal to about 10 nm. The width of the second and third semiconductor portions corresponds to the dimension of these portions perpendicular to the length and thickness of these portions.

The semiconductor of the third semiconductor portions may be amorphous. This can reinforce isolation between the quantum island formed by the second semiconductor portion and the source and drain regions formed by the first semiconductor portions.

The gate and the gate dielectric may cover the side flanks, particularly two side flanks of the second semiconductor portion. In this case, the transistor comprises a « Tri-Gate » or « Omega-Gate » type structure in which the gate and the gate dielectric cover three sides or three faces of the second semiconductor portion, that facilitates electrostatic coupling of the gate with the quantum island formed by the second semiconductor portion.

The first, second and third semiconductor portions may be located on a buried dielectric layer of a semiconductor on insulator type substrate.

A method of making a single-electron transistor is also disclosed, comprising at least the following steps:
    making the first semiconductor portions forming the source and drain regions;
    making a second semiconductor portion forming at least one quantum island;
    making third semiconductor portions forming tunnel junctions between the second semiconductor portion and the first semiconductor portions;
    making a gate and a gate dielectric arranged at least on the second semiconductor portion;
    in which a thickness of each of the first semiconductor portions is greater than the thickness of the second semiconductor portion, and in which a thickness of the second semiconductor portion is greater than the thickness of each of the third semiconductor portions.

Such a method can be implemented without having a semiconductor oxidation step to form the quantum island and the tunnel junctions of the transistor. In particular, the various semiconductor portions can be made by deposition, photolithography and etching steps.

The method may also comprise a step to make dielectric spacers located on the third semiconductor portions and bearing in contact with the side flanks of the gate, the gate dielectric and part of the second semiconductor portion.

In a first embodiment, the method may also comprise a first step to make a semiconductor element with a thickness equal to the thickness of the second semiconductor portion, comprising first and third parts from which the first and third semiconductor portions will be made, and a second part of which forms the second semiconductor portion, and in which:

the gate and the gate dielectric may be made at least on the second semiconductor portion, then the first and third parts of the semiconductor element may be partially etched such that their thicknesses are equal to the thicknesses of the third semiconductor portions, the third etched parts of the semiconductor element forming the third semiconductor portions, then the dielectric spacers may be made on the third semiconductor portions, then the first semiconductor portions are made from the first parts of the semiconductor element.

In a second embodiment, the method may also comprise a first step to make a semiconductor element with the same thickness as the second semiconductor portion, comprising first and third parts from which the first and third semiconductor portions will be made, and of which a second part forms the second semiconductor portion, and in which:

the gate and the gate dielectric may be made at least on the second semiconductor portion, then temporary spacers may be made on the third parts of the semiconductor element, then the first semiconductor portions may be made from the first parts of the semiconductor element, then the temporary spacers may be removed, then the third parts of the semiconductor element may be partially etched such that their thicknesses are the same as the thicknesses of the third semiconductor portions, the third etched parts of the semiconductor element forming the third semiconductor portions, then the dielectric spacers may be made on the third semiconductor portions.

The method according to this second embodiment has the advantage particularly over the first embodiment that it does not etch the first parts of the semiconductor element during etching forming the third semiconductor portions, that is a constraint because the remaining thickness of the first parts of the semiconductor element must be sufficient so that the first semiconductor portions can then be made for example by epitaxy. Therefore, such a method can be used to make thinner tunnel junctions, for example with a thickness between about 1 nm and 5 nm, which gives better isolation of the quantum island from the transistor source and drain. In the method according to this second embodiment, the first semiconductor portions are made before the third semiconductor portions.

In a third embodiment, the method may also comprise a first step to make a semiconductor element thicker than the second semiconductor portion, comprising first, second and third parts from which the first, second and third semiconductor portions will be made, and in which:

a temporary gate may be made at least on the second part of the semiconductor element, then temporary spacers may be made on the third parts of the semiconductor element, then the first semiconductor portions may be made from the first parts of the semiconductor element, then the temporary gate may be removed, then the second part of the semiconductor element may be partially etched such that its thickness is equal to the thickness of the second semiconductor portion, the second etched part of the semiconductor element forming the second semiconductor portion, then the gate and the gate dielectric may be made at least on the second semiconductor portion, then the temporary spacers may be removed, then the third parts of the semiconductor element may be partially etched such that their thicknesses are the same as the thicknesses of the third semiconductor portions, the third etched parts of the semiconductor element forming the third semiconductor portions, then the dielectric spacers may be made on the third semiconductor portions.

As for the second embodiment, the method according to this third embodiment has a particular advantage over the first embodiment in that it does not etch the first parts of the semiconductor element during etching forming the third semiconductor portions. Therefore such a method can be used to make thinner tunnel junctions, for example with a thickness between about 1 nm and 3 nm, giving better isolation of the quantum island from the transistor source and drain. Furthermore, the method according to this third embodiment also has the advantage that the thickness of the second semiconductor portion is defined during a specific step, for example by thinning, that has no effect on the first and third semiconductor portions, which gives good control over the thickness of the quantum island fabricated.

In one variant of this third embodiment, the steps to remove the temporary gate, to etch the second part of the semiconductor element and to make the gate and the gate dielectric may be carried out after the step to make the dielectric spacers.

For the second or third embodiment (or the variant of the third embodiment), the method may also comprise a step to amorphise the third parts of the semiconductor element carried out between the step to remove the temporary spacers and the step to partially etch the third parts of the semiconductor element or between the step to partially etch the third parts of the semiconductor element and the step to make the dielectric spacers.

In a fourth embodiment, the method may also comprise a first step to make a semiconductor element with a thickness greater than the thickness of the second semiconductor portion, comprising first, second and third parts from which the first, second and third semiconductor portions will be made, and in which:

a temporary gate may be made at least on the second part of the semiconductor element, then the first and third parts of the semiconductor element may be partially etched such that their thicknesses are equal to the thicknesses of the third semiconductor portions, the third etched parts of the semiconductor element forming the third semiconductor portions; then the dielectric spacers may be made on the third semiconductor portions, then the first semiconductor portions may be made from the first parts of the semiconductor element; then the temporary gate may be removed; then the second part of the semiconductor element may be partially etched such that its thickness is equal to the thickness of the second semiconductor portion, the second etched part of the semiconductor element forming the second semiconductor portion; then the gate and the gate dielectric may be made at least on the second semiconductor portion.

The method according to this fourth embodiment has the advantage that the thickness of the second semiconductor portion is defined during a special step, for example a thinning step, that does not affect the first and third semiconductor portions, so that the thickness of the quantum island can be well controlled.

The first semiconductor portions may be made by epitaxy.

The semiconductor element may be made by etching a semiconductor surface layer of a semiconductor on insulator type substrate.

BRIEF DESCRIPTION OF THE DRAWINGS

This invention will be better understood after reading the description of example embodiments given purely for guidance and in no way limitative with reference to the appended drawings on which:

FIGS. 3A to 3F diagrammatically show steps of a method of making a single-electron transistor according to a first embodiment;

Identical, similar or equivalent parts of the different figures described below have the same numeric references to facilitate the comparison of different figures.

The different parts shown on the figures are not necessarily all at the same scale, to make the figures more easily understandable.

The various possibilities (variants and embodiments) must be understood as being not mutually exclusive and they can be combined together.

DETAILED PRESENTATION OF PARTICULAR EMBODIMENTS

Figure 1:
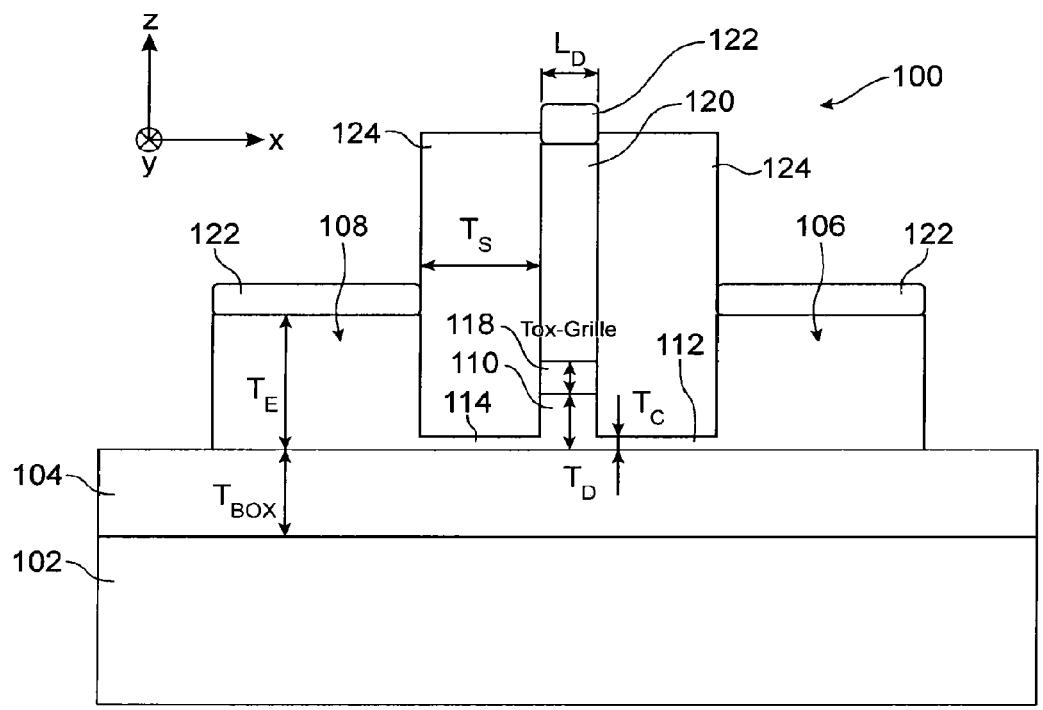
FIG. 1 diagrammatically shows a sectional profile view of a single-electron transistor according to one particular embodiment.

We refer firstly to FIG. 1, that shows a sectional profile view of a single-electron transistor (SET) 100, according to one particular embodiment.

The transistor 100 is made from a semiconductor on insulator type substrate, for example of the SOI type, and comprising a solid, or bulk, semiconductor layer 102, for example comprising silicon and forming the mechanical support for the transistor 100, on which there is a buried dielectric layer 104, also named BOX (Buried OXide), for example comprising silicon oxide. The substrate initially comprises a semiconductor surface layer located on the buried dielectric layer 104, starting from which an active region of the transistor 100 is made.

The active region of the transistor 100 comprises:
 first semiconductor portions 106 and 108 forming the source and drain respectively of the transistor 100;
 a second semiconductor portion 110 corresponding to a quantum island of the transistor 100;
 third semiconductor portions 112 and 114 each forming a tunnel junction between the second semiconductor portion 110 and one of the first semiconductor portions 106 and 108.

The semiconductor portions 106 to 114 for example comprise silicon and/or germanium and/or SiGe and/or InGaAs and/or InP and/or any other III-V material.

The transistor 100 also comprises a gate dielectric 118 particularly located on the second semiconductor portion 110. The gate dielectric 118 for example comprises $SiO_2$ or a dielectric with strong permittivity («High-K») such as $HfO_2$, $ZrO_2$, $TiO_2$, $Al_2O_3$, etc. A gate 120, for example a metal gate, is located on the gate dielectric 118.

In the example in FIG. 1, the gate 120 and the first semiconductor portions 106, 108 are covered by silicide portions 122 forming the electrical contacts of the transistor 100.

The transistor 100 also comprises dielectric spacers 124, for example comprising silicon nitride or oxide or SiBCN, and that are located on the third semiconductor portions 112, 114. These dielectric spacers 124 cover the side flanks of the gate 120 and the gate dielectric 118 and the side flanks of part of the second semiconductor portion 110.

Although it cannot be seen in FIG. 1, the gate dielectric 118 and the gate 120 extend along the Y axis such that the side flanks of the second semiconductor portion 110 that are perpendicular to this axis are covered by the gate dielectric 118 and the gate 120 forming a «Tri-Gate» or «Omega-Gate» type structure.

The second semiconductor portion 110 comprises a length $L_D$ (dimension along the X axis) equal to the length of the gate 120 that is for example between about 3 nm and 15 nm, and for example equal to about 7 nm. As this length becomes shorter, for example less than or equal to about 10 nm, the charge energy of the quantum island formed by the second semiconductor portion 110 increases. The thickness $T_D$ (dimension along the Z axis) of the second semiconductor portion 110 may also for example be between about 2 nm and 15 nm, and for example equal to about 6 nm. This thickness $T_D$ may be less than or equal to the initial thickness of the semiconductor surface layer of the substrate starting from which the active region of the transistor 100 is made.

Each of the third semiconductor portions 112, 114 comprises a length $T_S$ equal to the width of each dielectric spacer 124 and that may for example be between about 10 nm and 40 nm, and for example equal to about 15 nm, and a thickness $T_C$ for example between about 1 nm and 5 nm, and for example equal to 2 nm. These third semiconductor portions 112, 114 thus form tunnel junctions such that the quantum island formed by the second semiconductor portion can be well isolated from the source 106 and drain 108 of the transistor 100, avoiding disturbances generated by electron reservoirs formed by the source 106 and drain 108 on electrons present in the quantum island 110.

The thickness $T_E$ of the first semiconductor portions 106 and 108 may for example be between about 10 nm and 40 nm, and for example equal to about 25 nm. Such a thickness $T_E$ can reduce access resistances to source and drain regions of the transistor 100 that for example may be between about 200 Ω·μm and 300 Ω·μm.

The width (dimension along the Y axis) of the second semiconductor portion 110 is here equal to the width of the third semiconductor portions 112, 114, and is advantageously less than or equal to about 10 nm.

The buried dielectric layer 104 has a thickness $T_{BOX}$ for example between about 10 nm and 400 nm, and for example equal to about 145 nm. This thickness $T_{BOX}$ can be reduced, for example it can be between about 10 nm and 20 nm, and for example equal to about 15 nm, particularly when the transistor 100 comprises a back gate formed in the solid layer 102 and that can be used to polarise the back face of the transistor to modulate the charge in the quantum island 110 of the transistor 100.

The gate dielectric 118 has a thickness $T_{OX\_GRILLE}$ for example between about 1 nm and 10 nm.

The various elements of the transistor 100 are sized particularly to obtain a charge energy of the quantum island 100 equal to about 100 meV more than the thermal activation energy kT of electrons in the quantum island 110, that for example is equal to about 25 meV, and thus avoid unwanted changes of energy levels of electrons in the quantum island 110 that could occur when the charge energy remains approximately equal to 25 meV.

Simulations of the calculated charge energy in the quantum island 110 of the transistor 100 are made below to determine the influence of the dimensions of the various elements of the transistor 100 on this energy. In these simulations, the dielectric spacers 124 comprise silicon nitride. The gate dielectric 118 in this case comprises 2 nm of $SiO_2$ and 2 nm of $HfO_2$. The elements 106, 108, 110, 112 and 114 are made of silicon. The gate 120 is a metal gate.

A first simulation is made by fixing the dimensions $L_D=T_D=8$ nm, $T_S=10$ nm and $T_{OX\_GRILLE}=2$ nm so as to evaluate the influence of the thickness $T_C$ of the tunnel junctions 112, 114 on the charge energy of the quantum island 110 of the transistor 100.

| | $T_c$ (nm) | | | | | |
|---|---|---|---|---|---|---|
| | 2 | 3 | 4 | 5 | 6 | 7 |
| E charge (meV) | 47.4 | 46.4 | 44.9 | 42.3 | 37.6 | 30.7 |

The above table shows a clear increase of the charge energy when the thickness $T_C$ of the tunnel junctions 112, 114 reduces because the reduction of this thickness $T_C$ of the tunnel junctions 112, 114 located on each side of the quantum island 110 increases the barrier height on each side of the quantum island 110.

A second simulation is made by fixing the dimensions $L_D=T_D=8$ nm, $T_C=3$ nm and $T_{OX\_GRILLE}=3$ nm so as to evaluate the influence of the length $T_S$ of the tunnel junctions 112, 114 on the charge energy of the quantum island 110 of the transistor 100.

| | $T_s$ (nm) | | | | | | | |
|---|---|---|---|---|---|---|---|---|
| | 4 | 5 | 6 | 7 | 8 | 9 | 10 | 11 |
| E charge (meV) | 45.3 | 46.46 | 47.17 | 47.7 | 48.1 | 48.37 | 48.56 | 48.71 |

| | $T_s$ (nm) | | |
|---|---|---|---|
| | 12 | 13 | 14 |
| E charge (meV) | 48.82 | 48.9 | 48.97 |

The above table shows an increase in the charge energy when the length $T_S$ of the tunnel junctions 112, 114 increases because an increase of this length $T_S$ of the tunnel junctions 112, 114 located on each side of the quantum island 110 increases isolation of the quantum island 110 from the electron reservoirs formed by the source region 106 and drain region 108 of the transistor 100. However this increase becomes very small starting from $T_S=10$ nm.

A third simulation is made by fixing the dimensions $L_D=8$ nm, $T_D=5$ nm, $T_C=3$ nm and $T_S=10$ nm so as to evaluate the influence of the thickness $T_{OX\_GRILLE}$ of the gate dielectric 118 on the charge energy of the quantum island 110 of the transistor 100.

| | $T_{OX\_GRILLE}$ (nm) | | | | | | | |
|---|---|---|---|---|---|---|---|---|
| | 1 | 2 | 3 | 4 | 5 | 6 | 7 | 8 |
| E charge (meV) | 54.78 | 64.51 | 71 | 75.1 | 78.37 | 80.57 | 82.48 | 83.6 |

The above table shows that as the thickness $T_{OX\_GRILLE}$ increases, the charge energy in the quantum island 110 also increases. Therefore, the thickness $T_{OX\_GRILLE}$ is chosen to be sufficiently large to prevent disturbance of electrons present in the quantum island 110 by the gate 120, and to facilitate the single-electron effect in the transistor 100.

Figure 2:
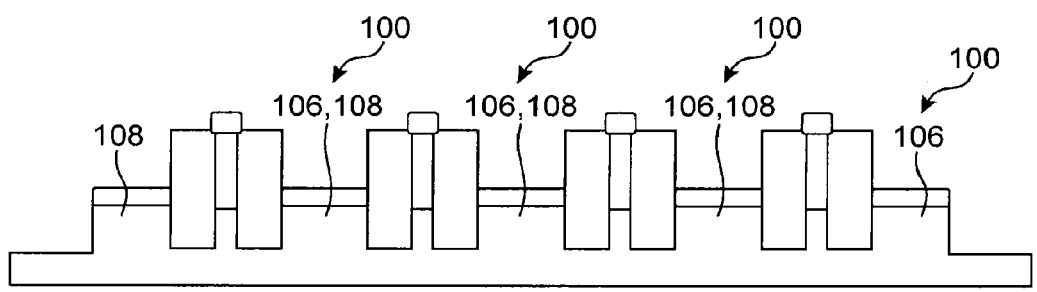
FIG. 2 diagrammatically shows a sectional profile view of several single-electron transistors made on the same substrate and connected to each other in series.

Several transistors 100 may advantageously be made side by side on the same substrate, such that they are electrically connected with each other in series. FIG. 2 shows four transistors 100 each similar to the transistor described above with reference to FIG. 1. In this configuration, the first semiconductor portions 106, 108 located between two transistors 100 located side by side are common to these two transistors and therefore form the drain region of one of the two transistors and the source region of the other of the two transistors. The length (dimension along the X axis) of such a first portion 106, 108 may for example be between about 50 nm and several hundred nm, and for example equal to about 50 nm.

A method of making the transistor 100 according to a first embodiment is described below with reference to FIGS. 3A to 3F.

Figure 3E:
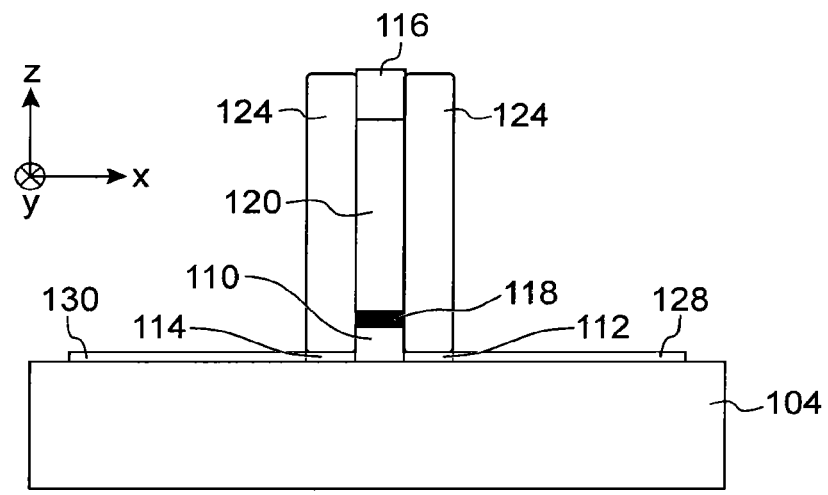

This method is implemented from an 501 substrate comprising a solid semiconductor layer 102 (not shown on FIGS. 3A to 3F), the buried dielectric layer 104 and the semiconductor surface layer referenced 105 in FIG. 3A and for example comprising silicon and/or germanium and/or SiGe and/or InGaAs and/or InP and/or any other III-V material. In this case the thickness of the surface layer 105 is equal to the thickness of the quantum island of the transistor 100 that will be made, in other words it is equal to the thickness $T_D$ of the second semiconductor portion 110 of the transistor 100 described above with reference to FIG. 1.

The layer 105 is etched such that the remaining portions of this layer 105 form semiconductor nanowires 126, in other words portions each with an elongated shape, in which the largest dimension (length) lies in the principal plane of the substrate (plane (X,Y)). In FIG. 3B, the length of the nanowires 126 is the dimension parallel to the X axis, the width of the nanowires 126 is the dimension parallel to the Y axis and the thickness of the nanowires 126 (equal to the thickness $T_D$ of the second semiconductor portion 110) is the dimension parallel to the Z axis. Advantageously, the width W of the nanowires 126, that is equal to the width of the second semiconductor portion 110 and the width of the third semiconductor portions 112, 114, is less than or equal to about 10 nm, and for example is equal to about 5 nm.

In the example described herein, the etching carried out to etch the layer 105 also etches part of the thickness of the buried dielectric layer 104 according to the pattern of the nanowires 126, while also forming a slight setback of the dielectric material of the layer 104 under the edges of the nanowires 126. This overetching is not compulsory but it does improve electrostatic coupling of the gate 120.

In this case, each of the nanowires 126 will be used to make a single-electron transistor 100, and comprises first parts 128, 130 from which the first semiconductor portions 106, 108 will be made, third parts 132, 134 from which the third semiconductor portions 112, 114 will be made, and a second part forming the second semiconductor portion 110 (these various parts can be seen from FIG. 3C).

The remaining part of the description applies to production of a single transistor 100.

After this etching, the materials of the gate dielectric 118 and of the gate 120 are deposited. A hard stencil 116 is then made on these layers of materials that are then etched according to the hard stencil pattern that corresponds to that of the gate of the transistor 100 (FIG. 3C). The gate thus made is located particularly on the second semiconductor portion 110 that will form the quantum island of the transistor 100. These steps to form the gate of the transistor 100 are identical to the conventional steps for making a gate of a CMOS transistor.

Although this cannot be seen in FIG. 3C, the gate dielectric 118 and the gate 120 extend along the Y axis such that the side flanks of the second semiconductor portion 110 that are perpendicular to this axis are covered by the gate dielectric 118 and the gate 120 forming a «Tri-Gate» or «Omega-Gate» type structure.

Parts of the nanowire 126 that are not covered by the gate 120 and the gate dielectric 118, in other words parts 128, 130, 132 and 134, are then partially etched along the direction of their thicknesses so as to keep only a semiconductor thickness equal to the thickness $T_C$ of the third semiconductor portions 112, 114 formed by this etching (FIG. 3D). The third semiconductor portions 112, 114 thus made form constrictions that will act as tunnel barriers between the quantum island 110 and the source region 106 and the drain region 108 of the transistor 100.

This remaining semiconductor thickness is also chosen such that the first etched parts 128, 130 are sufficiently thick so that epitaxy can be carried out from these etched parts 128, 130 to form the first semiconductor portions 106, 108.

In usual thin film CMOS technologies (for example such as the FDSOI technology), such etching of the semiconducting active layer must be avoided because it would create problems of access resistances that could degrade the performances of MOSFET devices.

After this etching, the dielectric spacers 124 are made on the third portions 112, 114, around the hard stencil 116, the gate 120, the gate dielectric 118 and part of the second portion 110, by deposition and etching of one or several dielectric materials (FIG. 3E).

Figure 3F:
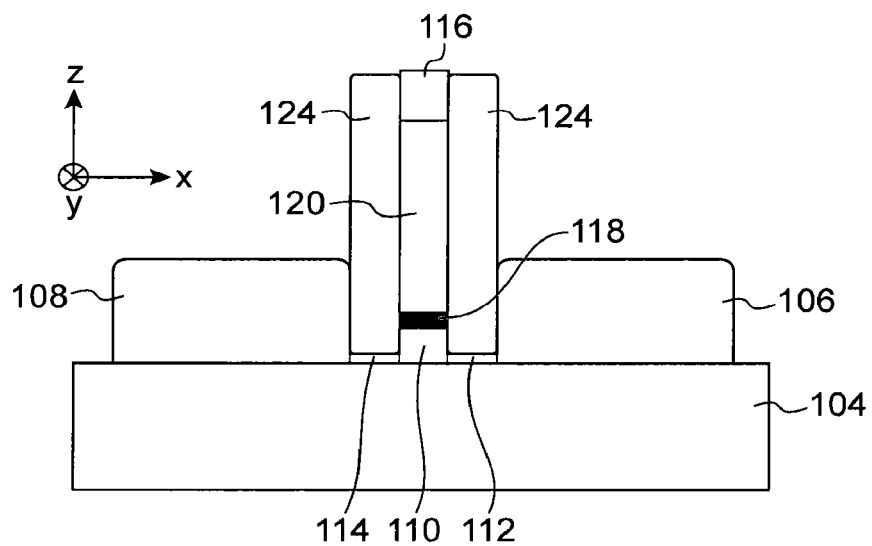

A semiconductor epitaxy is then carried out from parts 128, 130 of the nanowire 126 not covered by the gate 120 and by the dielectric spacers 124, thus forming the first semiconductor portions 106, 108 corresponding to the source and drain regions of the transistor 100 (FIG. 3F).

The transistor 100 is then completed by etching the hard stencil 116 and parts of the dielectric spacers 124 covering the side flanks of the hard stencil 116. The silicide portions 122 are then made on the gate 120 and on the source region 106 and drain region 108.

A method of making a second embodiment of the transistor 100 is described below with reference to FIGS. 4A to 4G.

Figure 4A:
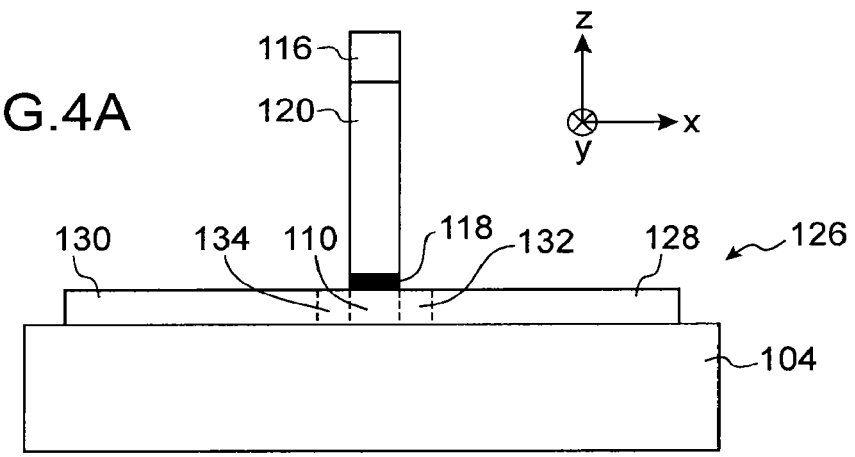
FIGS. 4A to 4G diagrammatically show steps of a method of making a single-electron transistor according to a second embodiment.

The steps described above with reference to FIGS. 3A to 3C are firstly implemented so as to achieve the structure shown in FIG. 4A.

Figure 4B:
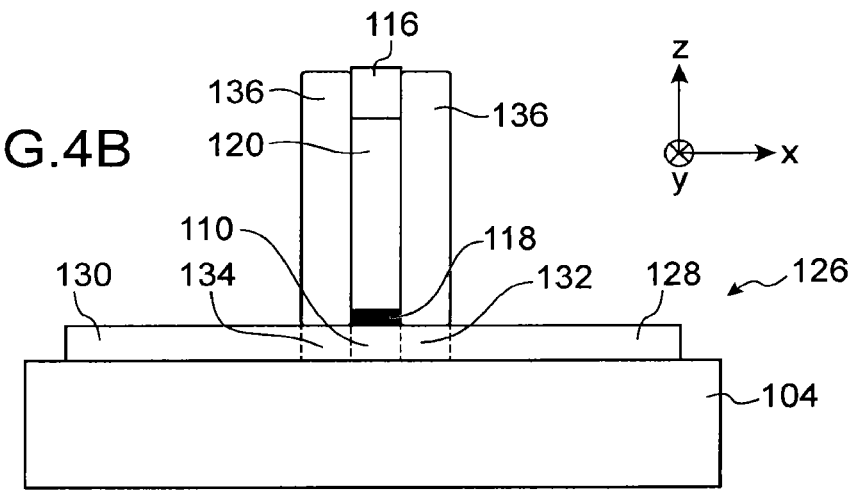

At this stage, unlike the case with the first embodiment described above in which partial etching of the thickness of the semiconductor not covered by the gate is done, temporary spacers 136, for example comprising nitride such as SiN or SiBCN, are made on the third parts 132, 134 of the nanowire 126, around the hard stencil 116, of the gate 120, the gate dielectric 118 and part of the second portion 110 (FIG. 4B).

Figure 4C:
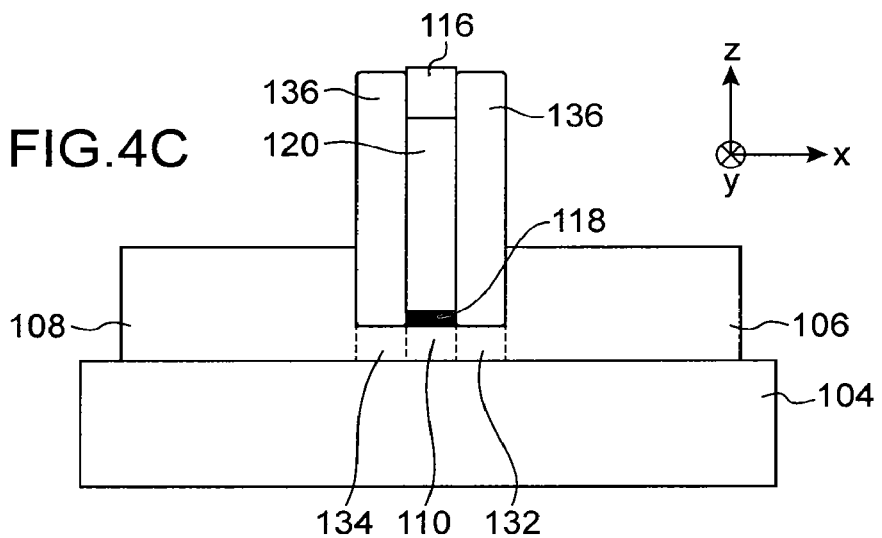

The first semiconductor portions 106, 108 are then made by epitaxy of the semiconductor starting from parts of the nanowire 126 not covered by the gate 120 and by the temporary spacers 136, in other words the first parts 128 and 130, thus forming the first semiconductor portions 106, 108 corresponding to the source and drain regions of the transistor 100 (FIG. 4C).

Figure 4D:
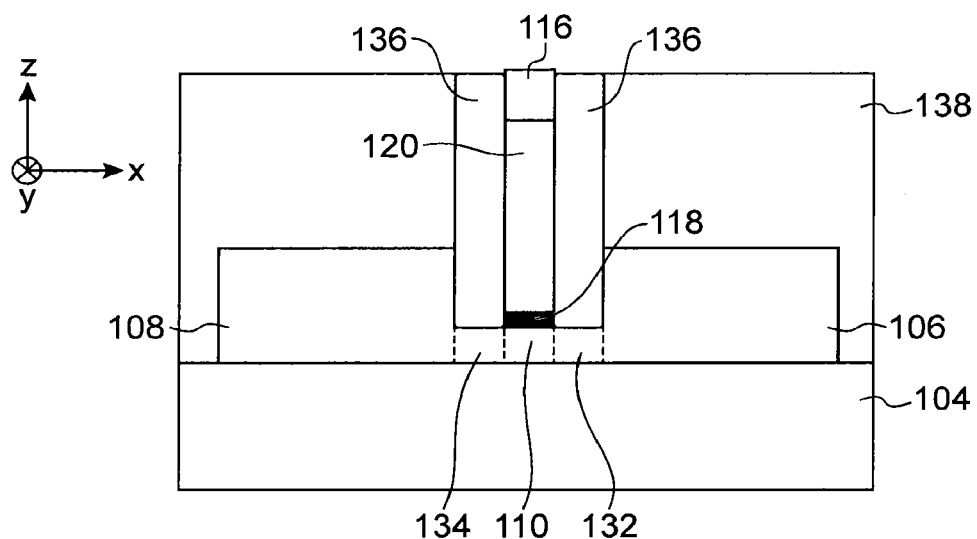

After this epitaxy, a dielectric material 138, for example semiconductor oxide, is deposited on the obtained structure and a planarization step such as CMP (Chemical Mechanical Planarization) is carried out so as to planarize this dielectric material 138 stopping on the hard stencil 116 (FIG. 4D).

Figure 4E:
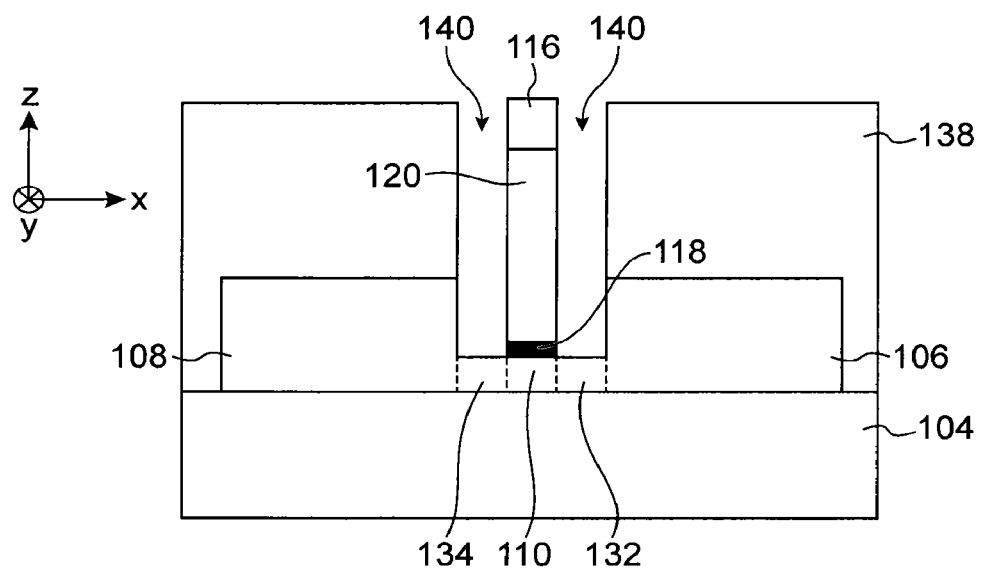

The temporary spacers 136 are then removed selectively relative to the dielectric material 138, for example by selective etching relative to the dielectric material 138, stopping on the semiconductor of the third parts 132, 134 of the nanowire 126 (FIG. 4E). Therefore, the temporary spacers 136 are made with one or several dielectric materials that can be selectively etched relative to the dielectric material 138. Removal of the temporary spacers 136 creates empty spaces 140 that can be used to access third parts 132, 134 of the nanowire 126.

Figure 4F:
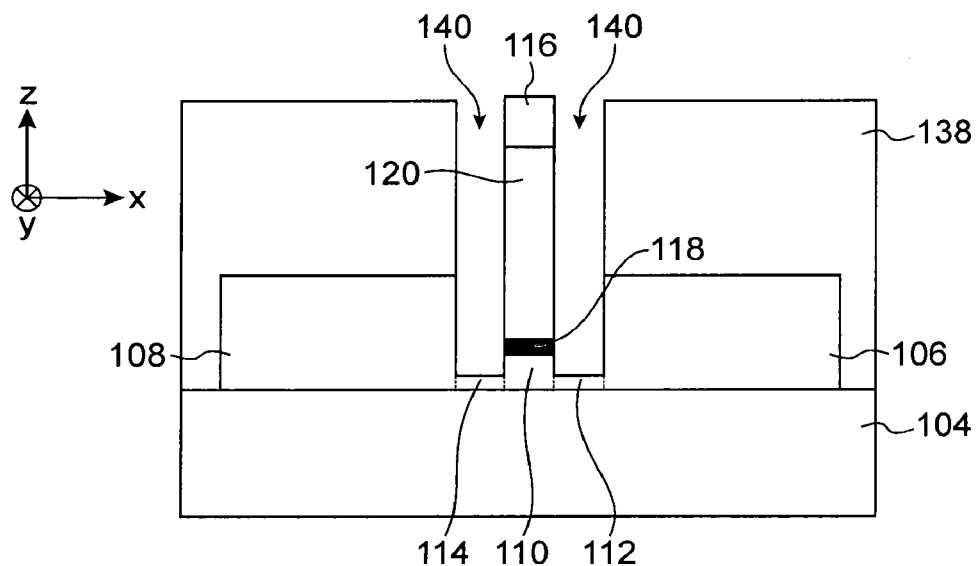

The third parts 132, 134 of the nanowire 126 are then thinned by etching to achieve the required thickness $T_C$ (without being limited to a thickness in which epitaxy can be done to form the source and drain regions of the transistor, as is the case in the first making method disclosed above), and thus form the third semiconductor portions 112, 114 that for example have a thickness $T_C$ equal to about 2 nm (FIG. 4F).

A this stage of the method, it may be advantageous to make local amorphisation of the third semiconductor portions 112, 114, for example by ionic implantation of silicon or germanium in the semiconductor of the third portions 112, 114, from the empty spaces 140, which reinforces the confinement potential of the quantum island 110 of the transistor 100. Apart from these portions 112, 114 made of an amorphous semiconductor, the other portions 106, 108 and 110 comprise crystalline semiconductor.

Figure 4G:
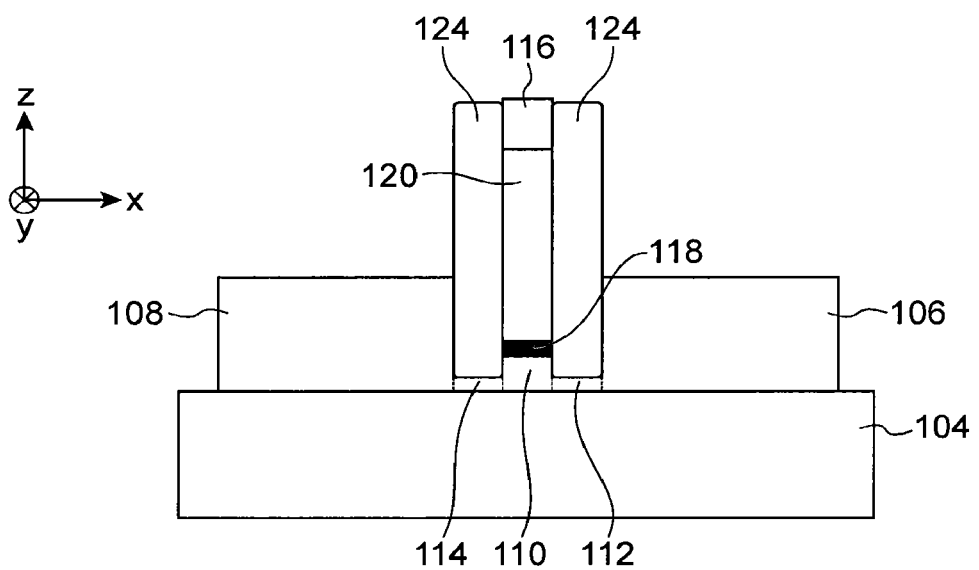

The dielectric material 138 is then removed and the dielectric spacers 124 are then made by deposition and etching at empty locations formed by removal of the temporary spacers 136 on the third semiconductor portions 112, 114 (FIG. 4G).

The transistor 100 is then completed by etching the hard stencil 116 and the parts of the dielectric spacers 124 covering the side flanks of the hard stencil 116. The silicide portions 122 are then made on the gate 120 and on the source region 106 and drain region 108.

A method of making the transistor 100 according to a third embodiment is described below with reference to FIGS. 5A to 5E.

Figure 5A:
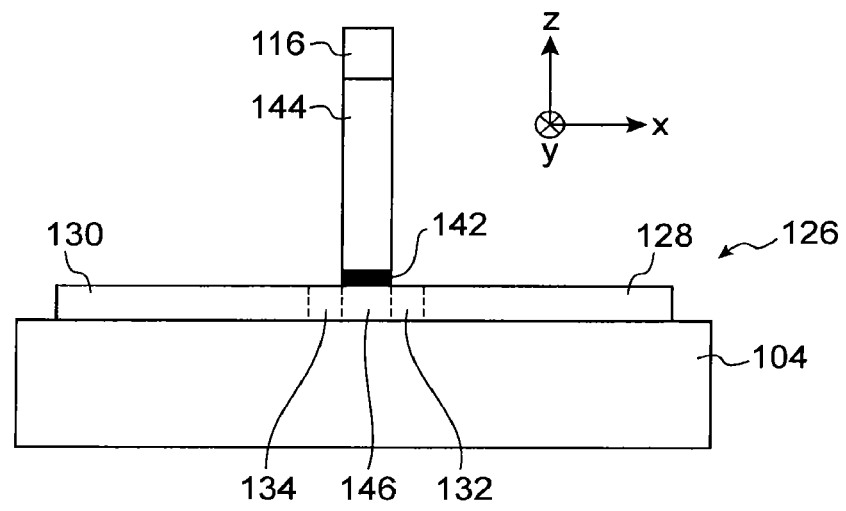
FIGS. 5A to 5E diagrammatically show steps of a method of making a single-electron transistor according to a third embodiment.
Figure 5B:
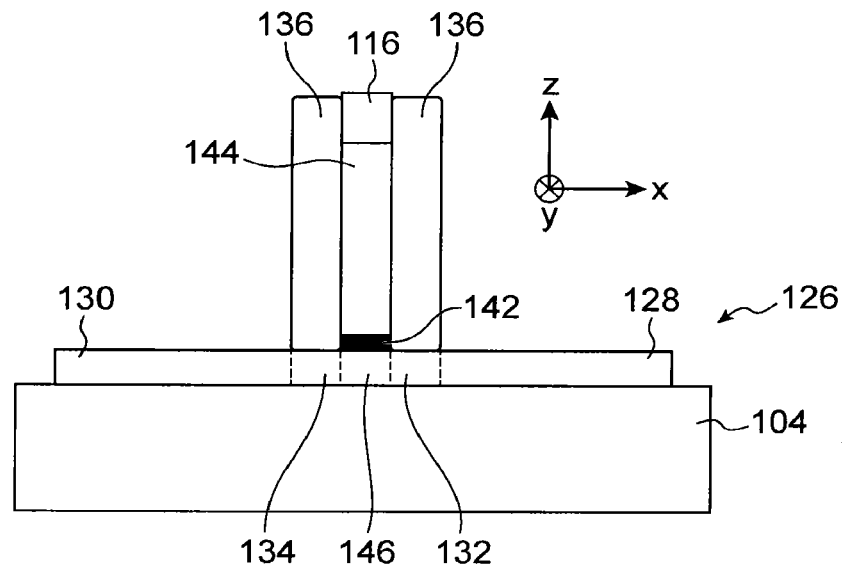

The steps described above with reference to FIGS. 3A to 3C are implemented firstly to achieve the structure shown in FIG. 5A. However, unlike the two previous embodiments in which the nanowire 126 is made such that its thickness is equal to the thickness of the second portion 110, in this case the thickness of the nanowire 126 is greater than the required thickness $T_D$ for the quantum island. Also, unlike the two previous embodiments in which the gate 120 and the gate dielectric 118 are made in the second portion 110, a dummy, or temporary, gate comprising a dielectric portion 142, for example made of $SiO_2$, and a polysilicon portion 144, is made on the second part 146 of the nanowire 126 (the thickness of this second part 146 being greater than the required thickness $T_D$ for the quantum island).

Figure 5C:
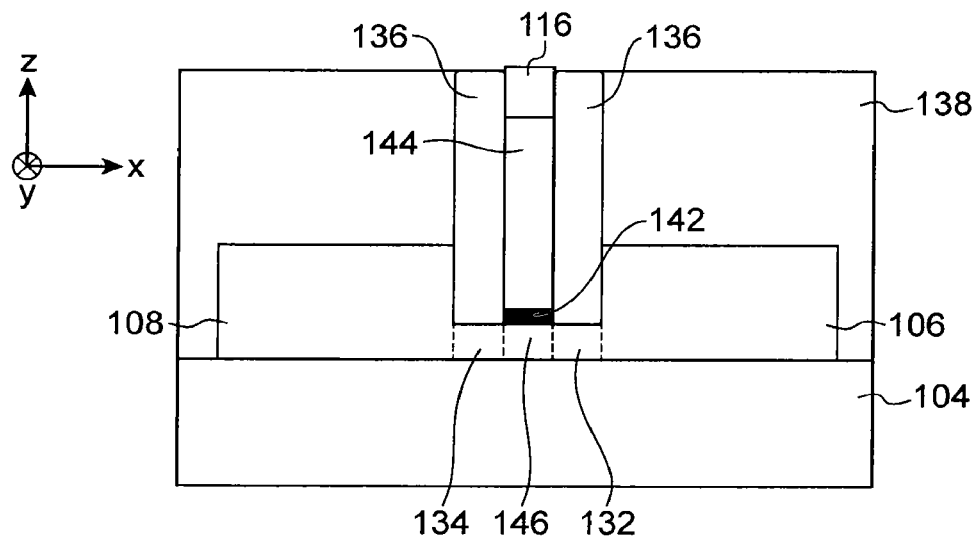

As in the second embodiment, the temporary spacers 136 are then made (FIG. 5B), then the source 106 and drain 108 are made by epitaxy, the assembly being covered by the dielectric material 138 that is planarized with stopping on the hard stencil 116 (FIG. 5C).

Figure 5D:
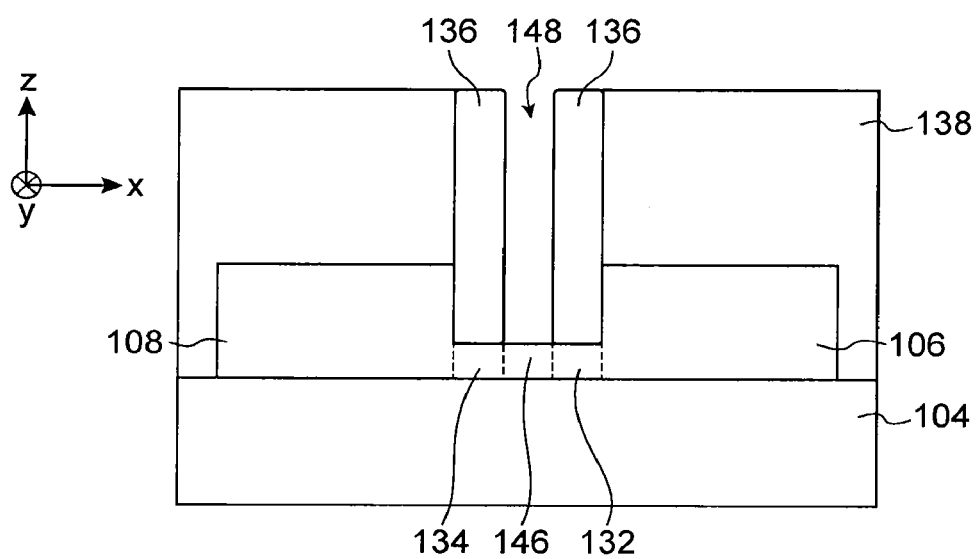

The hard stencil 116 is then removed. The polysilicon portion 144 is then removed for example by chemical etching using a TMAH solution. A slight deoxidation is finally performed to remove the dielectric portion 142 (FIG. 5D). An empty space 148 then provides access to the second part 146 of the nanowire 126.

The semiconductor of the second part 146 is then thinned to form the second portion 110 with the required thickness $T_D$. This thinning may be done to achieve a thickness of the island equal to a few nanometers if necessary, for example between about 1 nm and 5 nm. This thinning is done only to form the second portion 110 and it can give good control over the thickness of the quantum island of the transistor 100.

Figure 5E:
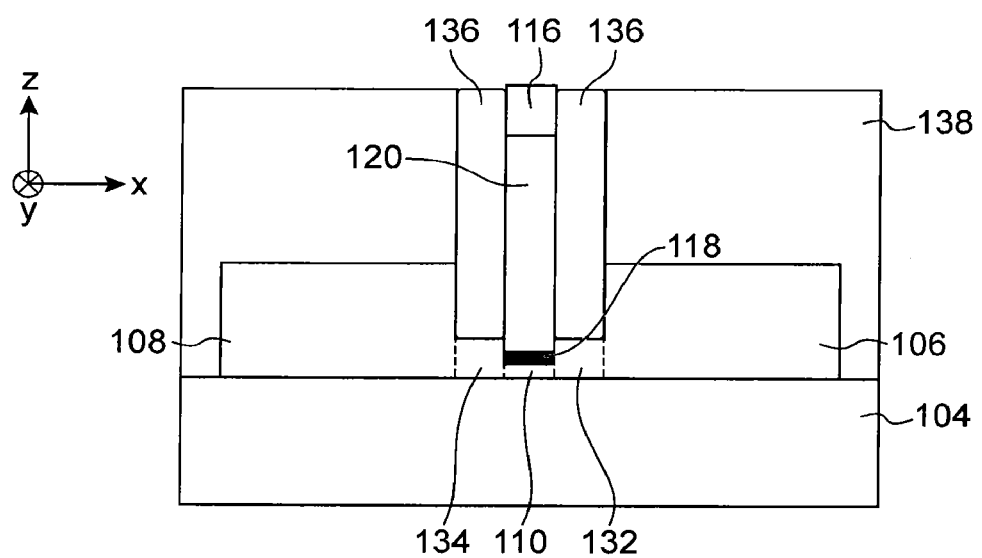

The gate dielectric 118, the gate 120 and the hard stencil 116 are then made in the empty space 148 (FIG. 5E).

The transistor 100 is then completed as in the second embodiment using the steps described above with reference to FIGS. 4E to 4G, then by etching the hard stencil 116 and the parts of the dielectric spacers 124 covering the side flanks of the hard stencil 116, and making the silicide portions 122 on the gate 120 and on the source region 106 and drain region 108. The semiconductor of the third portions 112, 114 may or may not be amorphised.

In one variant of this third embodiment, the steps to remove the temporary gate (142+144), to etch the second part 146 and to make the gate 120 and the gate dielectric 118 may be carried out after the steps to remove the temporary spacers 136, to thin the third parts 132, 134 and to make the dielectric spacers 124, in other words after the steps described above with reference to FIGS. 4A to 4G.

The transistor 100 may also be made using a method according to a fourth embodiment. In this fourth embodiment, the structure described above with reference to FIG. 5A, particularly comprising the temporary gate 142+144, is made. Then, instead of making the temporary spacers 136, the dielectric spacers 124 (in other words the final dielectric spacers of the transistor 100) are made. The steps described previously with reference to FIGS. 5C to 5E of making the dielectric material 138, eliminating the temporary gate and making the gate dielectric 118 and the gate 120, are then carried out. The transistor 100 is then completed by eliminating the dielectric material 138, etching the hard stencil 116 and the parts of the dielectric spacers 124 covering the side flanks of the hard stencil 116, and making the silicide portions 122 on the gate 120 and on the source region 106 and drain region 108.

According to another method, epitaxy can be done firstly over the entire nanowire to obtain a thickness corresponding to the required thickness for the source and drain, and then a temporary gate and temporary spacers can be made, and the method can be completed by first thinning in order to make the island and second thinning in order to form tunnel junctions.

The invention claimed is:

1. A single-electron transistor comprising:
first semiconductor portions forming source and drain regions,
a second semiconductor portion forming at least one quantum island,
third semiconductor portions forming tunnel junctions between the second semiconductor portion and the first semiconductor portions, and
a gate and a gate dielectric located on at least the second semiconductor portion,
wherein a thickness of each of the first semiconductor portions is greater than the thickness of the second semiconductor portion, and a thickness of the second semiconductor portion is greater than the thickness of each of the third semiconductor portions, and the first, second and third semiconductor portions are continuously formed, and
wherein a semiconductor of the third semiconductor portions is amorphous and a semiconductor of the first and second semiconductor portions is crystalline.

2. The single-electron transistor according to claim 1, also comprising dielectric spacers located on the third semiconductor portions and bearing in contact with the side flanks of the gate, the gate dielectric and part of the second semiconductor portion.

3. The single-electron transistor according to claim 1, wherein the thickness of the second semiconductor portion is between about 2 nm and 15 nm.

4. The single-electron transistor according to claim 1, wherein the thickness of each of the third semiconductor portions is between about 1 nm and 5 nm.

5. The single-electron transistor according to claim 1, wherein a length of each third semiconductor portion, that corresponds to a distance between the second semiconductor portion and one of the first semiconductor portions, is between about 10 nm and 40 nm.

6. The single-electron transistor according to claim 1, wherein a length of the second semiconductor portion that corresponds to a distance between the third semiconductor portions is less than or equal to about 10 nm.

7. The single-electron transistor according to claim 1, wherein the gate and the gate dielectric cover the side flanks of the second semiconductor portion.

8. The single-electron transistor according to claim 1, wherein the first, second and third semiconductor portions are located on a buried dielectric layer of a semiconductor on insulator type substrate.

9. A method of making a single-electron transistor, comprising:
making first semiconductor portions forming source and drain regions,
making a second semiconductor portion forming at least one quantum island,
making third semiconductor portions forming tunnel junctions between the second semiconductor portion and the first semiconductor portions, and
making a gate and a gate dielectric arranged at least on the second semiconductor portion,
wherein a thickness of each of the first semiconductor portions is greater than the thickness of the second semiconductor portion, and a thickness of the second semiconductor portion is greater than the thickness of each of the third semiconductor portions, and the first, second and third semiconductor portions are continuously formed, and
wherein a semiconductor of the third semiconductor portions is amorphous and a semiconductor of the first and second semiconductor portions is crystalline.

10. The method according to claim 9, also comprising making dielectric spacers located on the third semiconductor portions and bearing in contact with the side flanks of the gate, the gate dielectric and part of the second semiconductor portion.

11. The method according to claim 10, also comprising making a semiconductor element with a thickness equal to the thickness of the second semiconductor portion, comprising first and third parts from which the first and third semiconductor portions are made, and a second part of which forms the second semiconductor portion, and wherein:
- the gate and the gate dielectric are made at least on the second semiconductor portion, then
- the first and third parts of the semiconductor element are partially etched such that their thicknesses are equal to the thicknesses of the third semiconductor portions, the third etched parts of the semiconductor element forming the third semiconductor portions, then
- the dielectric spacers are made on the third semiconductor portions, then
- the first semiconductor portions are made from the first parts of the semiconductor element.

12. The method according to claim 10, also comprising making a semiconductor element with the same thickness as the second semiconductor portion, comprising first and third parts from which the first and third semiconductor portions are made, and of which a second part forms the second semiconductor portion, and wherein:
- the gate and the gate dielectric are made at least on the second semiconductor portion, then
- temporary spacers are made on the third parts of the semiconductor element, then
- the first semiconductor portions are made from the first parts of the semiconductor element, then
- the temporary spacers are removed, then
- the third parts of the semiconductor element are partially etched such that their thicknesses are the same as the thicknesses of the third semiconductor portions, the third etched parts of the semiconductor element forming the third semiconductor portions, then
- the dielectric spacers are made on the third semiconductor portions.

13. The method according to claim 10, also comprising making a semiconductor element thicker than the second semiconductor portion, comprising first, second and third parts from which the first, second and third semiconductor portions will be made, and wherein:
- a temporary gate is made at least on the second part of the semiconductor element, then
- temporary spacers are made on the third parts of the semiconductor element, then
- the first semiconductor portions are made from the first parts of the semiconductor element, then
- the temporary gate is removed, then
- the second part of the semiconductor element is partially etched such that its thickness is equal to the thickness of the second semiconductor portion, the second etched part of the semiconductor element forming the second semiconductor portion, then
- the gate and the gate dielectric are made at least on the second semiconductor portion, then
- the temporary spacers are removed, then
- the third parts of the semiconductor element are partially etched such that their thicknesses are the same as the thicknesses of the third semiconductor portions, the third etched parts of the semiconductor element forming the third semiconductor portions, then
- the dielectric spacers are made on the third semiconductor portions.

14. The method according to claim 13, wherein removing the temporary gate, etching the second part of the semiconductor element and making the gate and the gate dielectric are carried out after making the dielectric spacers.

15. The method according to claim 12, also comprising amorphizing the third parts of the semiconductor element between removing the temporary spacers and partially etching the third parts of the semiconductor element or between partially etching the third parts of the semiconductor element and making the dielectric spacers.

16. Method according to claim 10, also comprising making a semiconductor element with a thickness greater than the thickness of the second semiconductor portion, comprising first, second and third parts from which the first, second and third semiconductor portions will be made, and wherein:
- a temporary gate is made at least on the second part of the semiconductor element, then
- the first and third parts of the semiconductor element are partially etched such that their thicknesses are equal to the thicknesses of the third semiconductor portions, the third etched parts of the semiconductor element forming the third semiconductor portions, then
- the dielectric spacers are made on the third semiconductor portions, then
- the first semiconductor portions are made from the first parts of the semiconductor element,
- the temporary gate is removed, then
- the second part of the semiconductor element is partially etched such that its thickness is equal to the thickness of the second semiconductor portion, the second etched part of the semiconductor element forming the second semiconductor portion, then
- the gate and the gate dielectric are made at least on the second semiconductor portion.

17. The method according to claim 9, wherein the first semiconductor portions are made by epitaxy.

18. The single-electron transistor according to claim 1, wherein a length of the third semiconductor portion is between 15 nm and 40 nm.

* * * * *